US006904436B1

(12) United States Patent
Merchant et al.

(10) Patent No.: US 6,904,436 B1
(45) Date of Patent: *Jun. 7, 2005

(54) METHOD AND SYSTEM FOR GENERATING A BIT ORDER DATA STRUCTURE OF CONFIGURATION BITS FROM A SCHEMATIC HIERARCHY

(75) Inventors: James Daniel Merchant, Starkville, MS (US); Gordon Carskadon, Starkville, MS (US); Brian P. Evans, Starkville, MS (US); Jeffery Scott Hunt, Ackerman, MS (US); Anup Nayak, Fremont, CA (US); Andrew Wright, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 271 days.

This patent is subject to a terminal disclaimer.

(21) Appl. No.: 09/684,160

(22) Filed: Oct. 4, 2000

(51) Int. Cl.[7] .................................................. G06F 7/08
(52) U.S. Cl. ...................................... 707/100; 707/101
(58) Field of Search ................................ 707/100, 101, 707/102; 716/16, 17, 18, 8; 327/37, 38, 39; 326/37

(56) References Cited

U.S. PATENT DOCUMENTS

| 5,278,769 | A | * | 1/1994 | Bair et al. ..................... 703/19 |
| 5,359,537 | A | * | 10/1994 | Saucier et al. ................ 716/18 |
| 5,384,275 | A | * | 1/1995 | Sakashita .................... 257/208 |
| 5,426,379 | A | * | 6/1995 | Trimberger .................. 326/38 |
| 5,487,018 | A | * | 1/1996 | Loos et al. ................... 716/11 |
| 5,500,609 | A | * | 3/1996 | Kean ............................ 326/41 |
| 5,696,693 | A | * | 12/1997 | Aubel et al. .................. 716/8 |
| 5,754,441 | A | * | 5/1998 | Tokunoh et al. .............. 716/11 |
| 5,778,439 | A | * | 7/1998 | Trimberger et al. ........ 711/117 |
| 5,815,405 | A | * | 9/1998 | Baxter ......................... 716/16 |
| 5,821,772 | A | * | 10/1998 | Ong et al. .................... 326/38 |
| 5,838,583 | A | * | 11/1998 | Varadarajan et al. ............ 716/9 |
| 5,946,219 | A | * | 8/1999 | Mason et al. ................. 716/16 |
| 5,953,519 | A | * | 9/1999 | Fura ............................. 716/18 |
| 5,959,881 | A | * | 9/1999 | Trimberger et al. ........ 365/182 |
| 6,026,226 | A | * | 2/2000 | Heile et al. ................... 716/12 |
| 6,035,106 | A | * | 3/2000 | Carruthers et al. ............ 703/1 |
| 6,105,105 | A | * | 8/2000 | Trimberger ................. 711/103 |
| 6,118,938 | A | * | 9/2000 | Lawman et al. ............... 716/1 |
| 6,150,836 | A | * | 11/2000 | Abbott ......................... 326/38 |
| 6,195,304 | B1 | * | 2/2001 | Eto et al. .................... 365/222 |
| 6,204,687 | B1 | * | 3/2001 | Schultz et al. ............... 326/38 |
| 6,237,129 | B1 | * | 5/2001 | Patterson et al. .............. 716/8 |
| 6,292,018 | B1 | * | 9/2001 | Kean ........................... 326/39 |
| 6,311,316 | B1 | * | 10/2001 | Huggins et al. .............. 326/37 |
| 6,339,836 | B1 | * | 1/2002 | Eisenhofer et al. ............ 716/5 |
| 6,438,738 | B1 | * | 8/2002 | Elayda ........................ 716/16 |
| 6,490,712 | B1 | * | 12/2002 | Merchant et al. ............. 716/12 |

* cited by examiner

*Primary Examiner*—Kim Vu
*Assistant Examiner*—Thomas Gyorfi
(74) *Attorney, Agent, or Firm*—Wagner, Murabito & Hao LLP

(57) ABSTRACT

A method and system for automatically building a bit order data structure of configuration bits for a programmable logic device. One embodiment of the present invention first identifies a plurality of memory cells in a hierarchical schematic representation of the programmable device. Next, this embodiment determines a plurality of addresses corresponding to the plurality of memory cells. This embodiment next determines a plurality of logical names for the plurality of memory cells. Then, based on an order in which the plurality of addresses are to be loaded into the programmable logic device, this embodiment orders the plurality of logical names for the plurality of memory cells. Another embodiment first accesses a database comprising a plurality of logical names corresponding to a plurality of addresses. Then, this embodiment accesses a database specifying an order in which the plurality of addresses are to be loaded into the programmable logic device. Next, this embodiment orders the plurality of logical names based on the order specified in the database from the previous step.

16 Claims, 16 Drawing Sheets

254 — begin cl 188 422
256 — lb<0>/mc<0>/c<0>
256 — lb<0>/mc<0>/c<1>
256 — lb<0>/mc<0>/c<2>
spacer 8
endWordLine 0
256 — lb<0>/mc<1>/c<0>
256 — lb<0>/mc<1>/c<1>
256 — lb<0>/mc<1>/c<2>
spacer
endWordLine 1
256 — cm<1>/crcfg<2>/c<0>
256 — cm<1>/crcfg<2>/c<1>
256 — cm<1>/crcfg<2>/c<2>
256 — cm<1>/crcfg<2>/c<3>
258 end cl
260 inst cl c100 0 0
260 inst cl c101 0 1
260 inst cl c102 0 2
260 inst cl c103 0 3
260 inst cl c110 1 0

METHOD AND SYSTEM FOR GENERATING A BIT ORDER DATA STRUCTURE OF CONFIGURATION BITS FROM A SCHEMATIC HIERARCHY

FIELD OF THE INVENTION

Embodiments of the present invention relate to the field of programmable logic devices. Specifically, embodiments of the present invention relate to an system and method for generating a bit order data structure of configuration bits.

BACKGROUND ART

Integrated circuits, such as, for example, complex programmable logic devices (CPLD) comprise a large number and variety of programmable circuits. By selectively choosing which of the circuits on the CPLD are used and how the circuits are interconnected, a CPLD may be used to implement a wide range of custom circuit designs. Devices such as CPLDs have one or more arrays (e.g., configuration blocks) of memory cells (e.g., configuration bits) that configure the CPLD's functionality. Each of the memory cells (configuration bits) has an address which may be specified by a word-line and a bit-line. The configuration blocks are programmed at start-up by storing values into the configuration bits. The addresses of the configuration bits must also be determined for simulation. Due to the large number of configuration cells, the process of programming the configuration bits may be complex and problematic for complex PLDs.

In one conventional method, the memory cells (configuration bits) and their associated word-lines and bit-lines are identified manually, and the result would be specific to only one simulator. A separate computer program is written for each programmable logic device circuit design. Therefore, great care must be taken to avoid computer programming errors when using this cumbersome and tedious conventional method. Furthermore, each time the programmable logic device circuit design is changed, the program which identifies the memory cells and their associated word-lines and bit-lines must be changed, by once again manually identifying the wordline and bitline addresses of the configuration bits. Configuration bit errors due to manual entry mistakes may appear as circuit errors, thereby adding to the complexity and difficulty of circuit simulation.

Some conventional methods load the configuration bits into the CPLD serially. Therefore, the program which loads the configuration bits into the CPLD must know the correct order. As there may be over 1 million configuration bits, manually generating the order may be time consuming and error prone.

As the complexity of devices such as CPLDs increases, the number of memory cells (configuration bits) increases. Consequently, the risk of error increases when using a conventional manual method for address determination. Furthermore, as separate programs need to be written for each programmable logic device design change, the time spent programming increases dramatically. Clearly, this could delay getting a new product to market and increase design and test costs.

SUMMARY OF THE INVENTION

Therefore, it would be advantageous to provide a method and system for automatically building a database specifying the order in which configuration bits are to be loaded into a programmable logic device. A further need exists for such a method which may derive the information directly and automatically from a schematic hierarchy database of the programmable logic device. A further needs exists for a such method and system which may easily update the bit order data structure when changes are made to the input schematic database.

Embodiments of the present invention provide a method and system for automatically building a bit order data structure of configuration bits for a programmable logic device. Embodiments of the present invention provide for a method and system which derive the bit order data structure automatically from a schematic hierarchy database of the programmable logic device. Further embodiments provide for a method and system for easily updating the bit order data structure when changes are made to the input schematic database. Embodiments of the present invention provide these advantages and others not specifically mentioned above but described in the sections to follow.

A method and system for automatically building a bit order data structure of configuration bits for a programmable logic device is disclosed. One embodiment of the present invention first identifies a plurality of memory cells in a hierarchical schematic representation of the programmable device. Next, this embodiment determines a plurality of addresses corresponding to the plurality of memory cells. This embodiment next determines a plurality of logical names for the plurality of memory cells. Then, based on an order in which the plurality of addresses are to be loaded into the programmable logic device, this embodiment orders the plurality of logical names for the plurality of memory cells.

Another embodiment first accesses a database comprising a plurality of logical names corresponding to a plurality of addresses. Then, this embodiment accesses a database specifying an order in which the plurality of addresses are to be loaded into the programmable logic device. Next, this embodiment orders the plurality of logical names based on the order specified in the database from the previous step.

Another embodiment performs the steps of the previous paragraph, and in addition, inserts a placeholder into the order of logical names produced.

Still another embodiment of the present invention provides for a system for implementing a method of generating an order of loading data into a programmable logic device.

BRIEF DESCRIPTION OF THE DRAWINGS

FIG. 4C is an exemplary configuration bit order data structure, which an embodiment of the present invention produces as an output.

DETAILED DESCRIPTION OF THE INVENTION

Figure 1A:
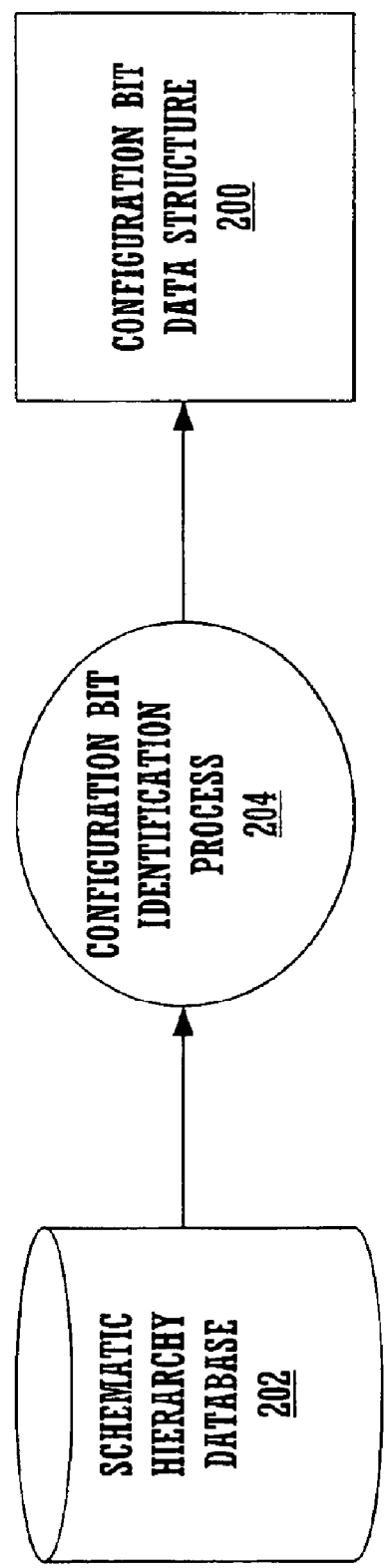
FIG. 1A is an diagram illustrating a schematic hierarchy database as input into an embodiment of the present invention which outputs a configuration bit data structure.

In the following detailed description of embodiments of the present invention, a method and system for automatically building a bit order data structure of configuration bits for a programmable logic device, numerous specific details are set forth in order to provide a thorough understanding of embodiments of the present invention. However, it will be recognized by one skilled in the art that embodiments of the present invention may be practiced without these specific details or with equivalents thereof. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "ordering" or "recognizing" or "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Generating a Bit Order Data Structure of Configuration Bits

Embodiments of the present invention provide for a method and system for automatically building a bit order data structure of configuration bits for a programmable logic device. First, an embodiment builds a configuration bit data structure from a schematic hierarchy of a programmable logic device. The data structure contains wordline and bitline addresses and logical names for each configuration bit. Then, by using an input database that specifies the order in which the wordlines and bitlines are to be loaded, an embodiment creates a bit order data structure.

Generating Configuration Circuit Addresses

The first step in an embodiment of the present invention is to generate a database of configuration circuit addresses. An embodiment of the invention traverses the hierarchy of schematics in order to identify every configuration bit (e.g., the lowest memory cell) in the entire hierarchy. This embodiment uses the instance name to identify configuration bits and the logical hierarchy of configuration bits.

Referring to FIG. 1A, embodiments of the present invention, a configuration bit identification process 204, may be used to produce a configuration bit data structure 200 from a schematic hierarchy database 202. For example, the schematic hierarchy database 202 may reflect the circuitry of a programmable logic device, such as a complex programmable logic device (CPLD). However, the present invention is not limited to using a schematic database 202 which represents a CPLD. The schematic hierarchy database 202 may be constructed by using any suitable software program, as will be well understood by those of ordinary skill in the art. For example, commercially available software from Cadence Design Systems, Inc., San Jose, Calif. may be used to build the schematic database 202. Embodiments of the present invention may operate on any level of the schematic hierarchy 202. An embodiment of the present invention performs the steps of traversing a schematic hierarchical database 202 and identifying the hierarchical logical name of a configuration bit, the schematic path name to the configuration bit, and wordline and bitline addresses of the configuration bit.

Figure 1B:
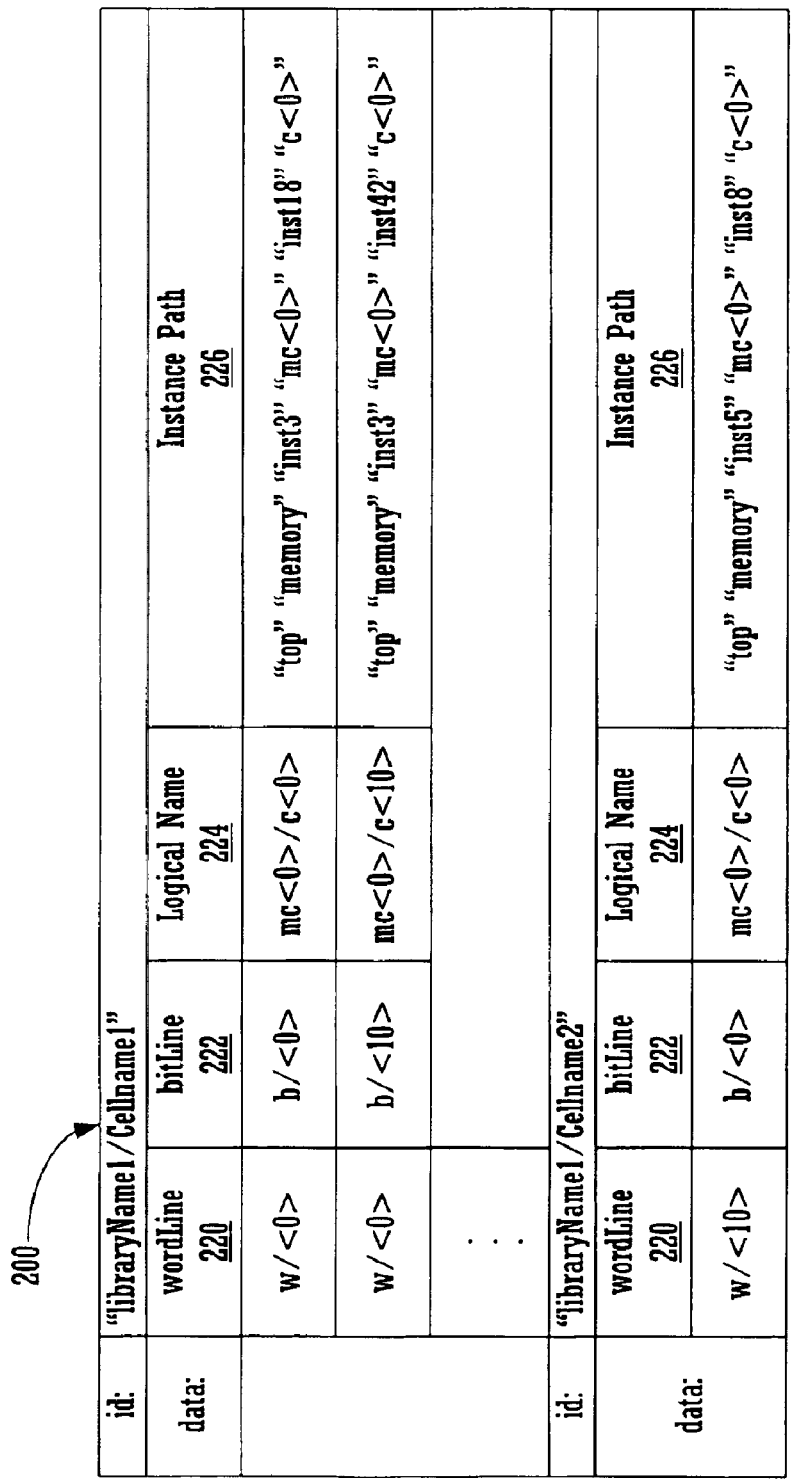
FIG. 1B illustrates an exemplary configuration bit data structure, which is the output of an embodiment of the present invention.

The output configuration bit data structure 200 of one embodiment is illustrated in FIG. 1B. Data structure 200 contains a configuration bit data structure entry for each library name and cell name that was traversed by this embodiment of the invention. For each library/cell combination (e.g., LibraryName 1/CellName 1) there is a list of the configuration bits that are contained in the schematic database 202.

Still referring to FIG. 1B, for example, a configuration bit (memory cell) is known by its wordline 220, its bitline 222, its logical name 224, and the schematic instance path 226 down to the configuration bit memory cell. Together, the bitline 222 and wordline 220 define the address of the configuration bit.

Figure 2A:
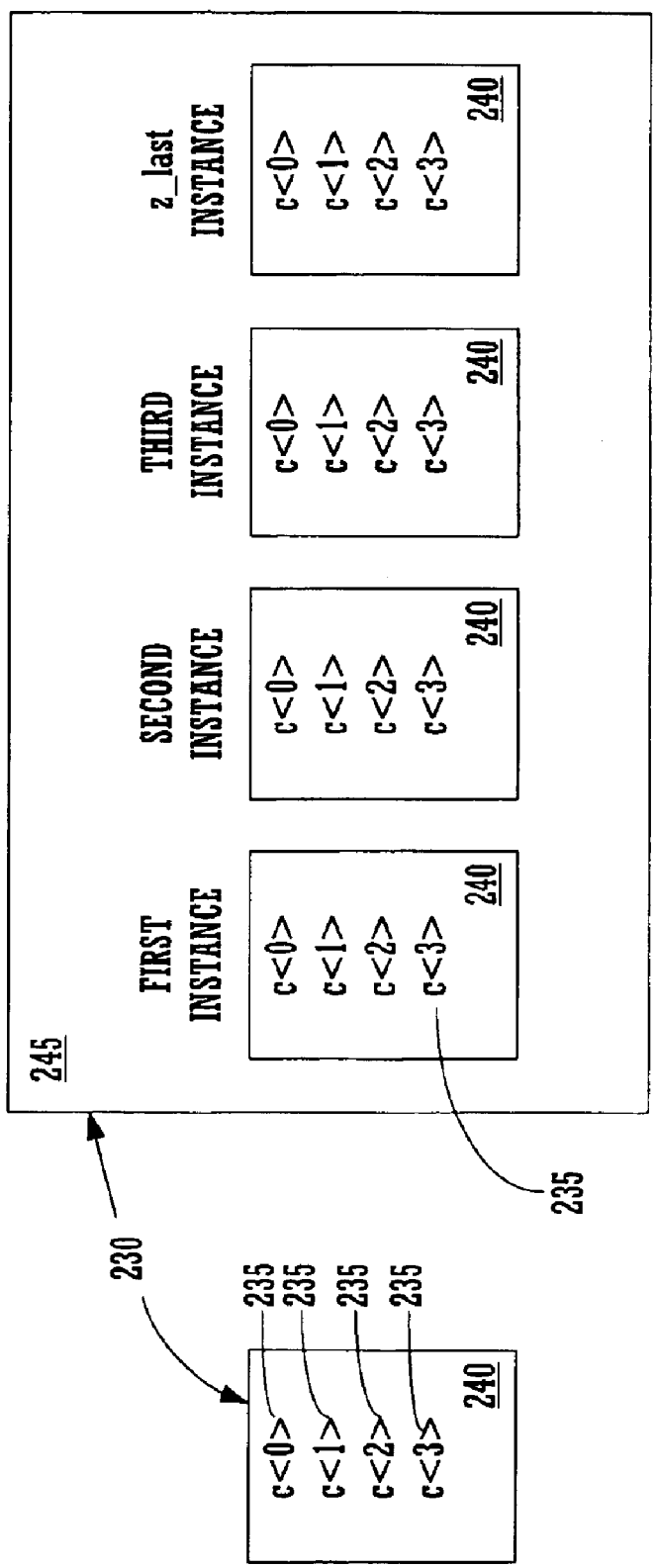
FIG. 2A, FIG. 2B, FIG. 2C, FIG. 2D, and FIG. 2E are diagrams illustrating renumbering configuration bits and other logical units, according to embodiments of the present invention.

An embodiment of the present invention renumbers logical units as a part of the process. FIG. 2A contains a diagram representing examples of cells 230, which contain instances of logical units, for example, configuration bits 235, macro cells 240, and logical blocks 245. These logical units may represent physical circuits which perform a logical function. Every logical unit has a numerical index associated with it. For example, the configuration bits 235 are numbered c<0>, c<1>, c<2>, and c<3>. The other logical units also have numerical indexes; however, they are not shown in FIG. 2A. A logical unit may be numbered by an instance name with a logical unit name and bus syntax (e.g. mc<3:0>). A logical unit may be numbered by instance name with a logical unit name and _# suffix (e.g., mc_3). Additionally, configuration bits may be numbered by instance names, such as C# (e.g., C4). A configuration bit 235 is a memory cell containing one bit of data and is at the lowest level of the logical hierarchy of the schematic database 202. Each configuration bit 235 has one wordline and one bitline (not shown) connected to it. Additionally, each of the higher level cells (e.g., a macro cell 240 or logical block 245) has at least one bitline and at least one wordline connected to it (not shown).

An understanding of bus expansion of instance names is important. When an embodiment hits an iterated instance, it will expand the instances in the order specified by the bus syntax. For example, if an instance is named "foo<0:7>", this embodiment will expand the configuration bits 235 for foo<0>, then <1>, etc., up to <7>. If it is named "foo<7:0>", this embodiment will expand the configuration bits 235 for foo<7>, then foo<6>, etc., down to foo<0>.

In this embodiment, the above instance naming convention must be followed for every logical unit and avoided for everything that is not a logical unit. For illustrative purposes, the following is an exemplary list of logical unit names for those cells and their logical hierarchy which contain configuration bits 235.

cl—Cluster
    lbp—cluster logic block input pim
        lbpmx—logic block pim mux
    crp—cluster ram input pim
        """"—cluster ram pim stage 1
            crp1mx—cluster ram stage 1 mux
        """"—cluster ram pim stage 2
            crp2mx—cluster ram pim stage 2 mux
    lb—cluster logic blocks
        ptck—clock product term
        ptrs—set-reset product term
        pt—product term
        ptm—ptm
        mc—macro cell
        srptmx—set-reset product term mux
    crcfg—cluster memory configuration bit
cr—cluster ram
    crcore—cluster memory core bit
ch—channel
    h2clp—hor channel to cluster pim
        """"—hor channel to cluster pim stage 1
            h2clps1mx—hor channel to cluster pim stage 1 mux
        """"—hor channel to cluster pim stage 2
            h2clps2mx—hor channel to cluster pim stage 2 mux
    h2vp—hor channel to vertical channel pim
        """"—hor channel to vertical channel pim stage 1
            h2vps1 mx—hor channel to vertical channel pim stage 1 mux
        """"—hor channel to vertical channel pim stage 2
            h2vps2mx—hor channel to vertical channel pim stage 2 mux
    h2cmp—hor channel to channel memory pim
        """"—hor channel to channel memory pim stage 1
            h2cmps1mx—hor channel to channel memory pim stage 1 mux
    h2ip—hor channel to io pim
        """"—hor channel to io pim stage 1
            h2ips1mx—hor channel to io pim stage 1 mux
        """"—hor channel to occ io pim
            h2ips2mx—hor channel to occ io pim mux
    v2clp—vert channel to cluster pim
        """"—vert channel to cluster pim stage 1
            v2clps1mx—vert channel to cluster pim stage 1 mux
        """"—vert channel to cluster pim stage 2
            v2clps2mx—vert channel to cluster pim stage 2 mux
    v2hp—vert channel to horizontal channel pim
        """"—vert channel to horizontal channel pim stage 1
            v2hps1mx—vert channel to horizontal channel pim stage 1 mux
        """"—vert channel to horizontal channel pim stage 2
            v2hps2mx—vert channel to horizontal channel pim stage 2 mux
    v2cmp—vert channel to channel memory pim
        """"—vert channel to channel memory pim stage 1
            v2cmps1mx—vert channel to channel memory pim stage 1 mux
        """"—vert channel to channel memory pim stage 2
            v2cmps2mx—vert channel to channel memory pim stage 2 mux
    v2ip—vert channel to io pim
        """"—vert channel to io pim stage 1
            v2ips1mx—vert channel to io pim stage 1 mux
        """"—vert channel to io pim stage 2
            v2ips2mx—vert channel to io pim stage 2 mux
    """"—cluster to vert channel output pim
        cl2vpmx—cluster to vert channel output pim mux
    """"—cluster to hor channel output pim
        cl2hpmx—cluster to hor channel output pim mux
    cmcfg—channel memory config bits
cm—channel memory
    cmcore—channel memory core
iob—IO block
    iocell—IO cell
cb—control block
    usercode—user code
    pllclkmux—pll and clock mux
    misc—misc bits for future use
    vreg—voltage regulator Referring to FIG. 2A, a re-numbering example will be discussed. FIG. 2A illustrates cells 230, which contain instances of macro cells 240 and configuration bits 235. Each macro cell 240 contains four configuration bits 235 numbered c<0>, c<1>, c<2>, and c<3>. The single logic block 245 contains four separate instances of macro cell 240.

Still referring the FIG. 2A, the four separate instances of macro cell 240 are named first, second, third and z_last. The instance names should be provided in the schematic database 202. An embodiment of the present invention will sort alphanumerically the instance names which were provided. Because it would be nonsensical for there to be four c<0> configuration bits 235 in logic block 245, an embodiment of the present invention will renumber the configuration bits 235 as illustrated in FIG. 2B.

Figure 2B:
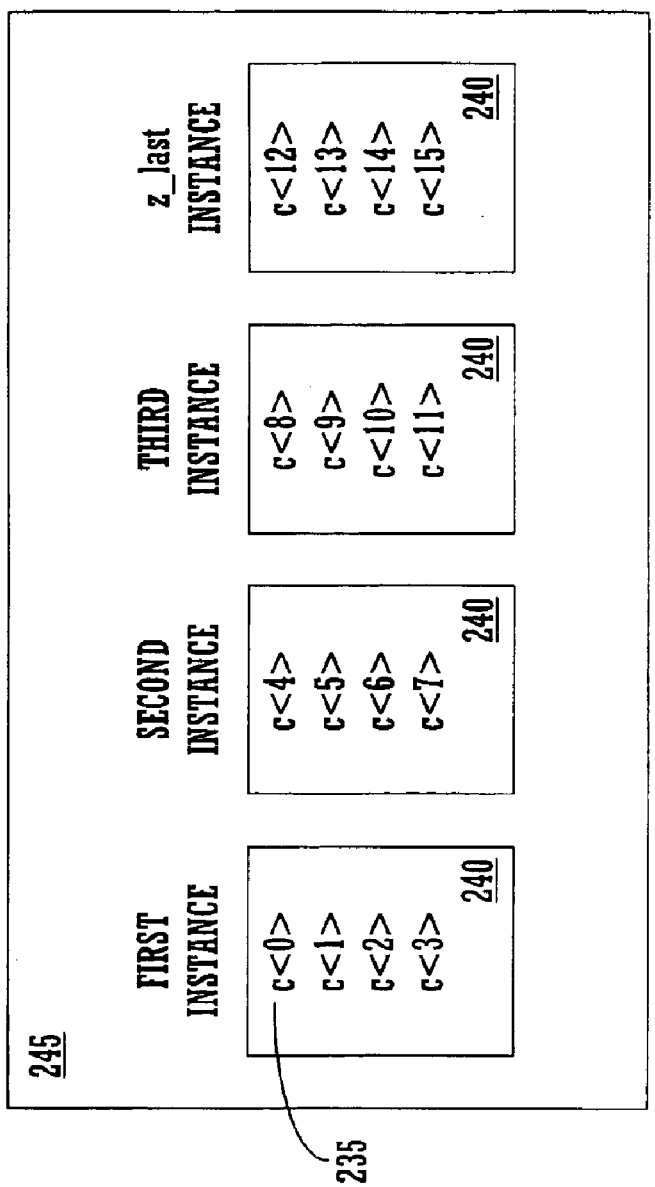

Referring to FIG. 2B, the configuration bits 235 are renumbered c<0> through c<15> based upon the alphanumeric sort of the instance names. Then, this embodiment will sort the instances in some fashion, for example alphanumerically. Finally configuration bits 235 are re-numbered. Thus, the second instance of macro cell 240 has its configuration bits 235 renumbered from c<4> through c<7>. The third instance of macro cell 240 has its configuration bits 235 renumbered from c<8> through c<11>. The final instance of macro cell 240 has its configuration bits 235 renumbered from c<12> through c<15>.

Figure 2C:
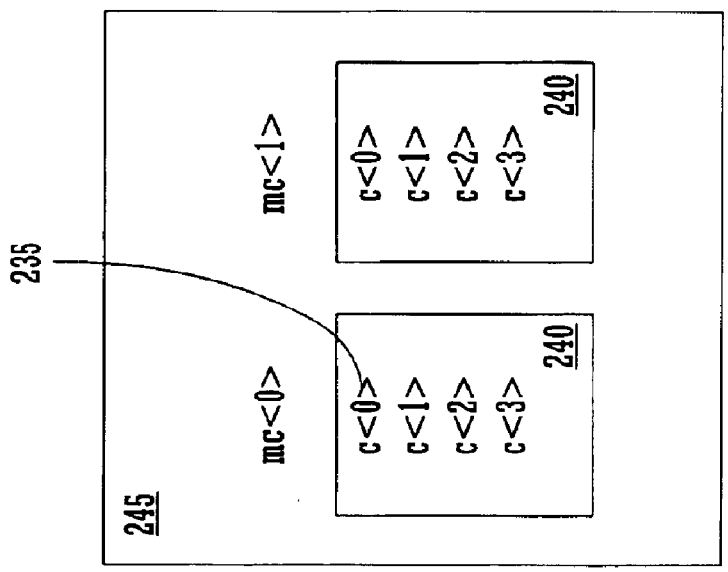
Figure 2C:
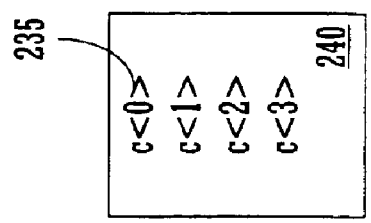

FIG. 2C illustrates a more complex example of renumbering logical units. FIG. 2C contains macro cell 240 much like the one in FIG. 2A. The logic block 245 contains two instances of macro cell 240. However, unlike the previous example, in this example the two instances represent new logical units of configuration bits 235. Therefore, the numbering of the configuration bits 235 in logic block 245 is mc<0>/c<0> through mc<0>/c<3> for the first instance of macro cell 240 within logic block 245. For the second instance of macro cell 240, the numbering is mc<1>/c<0> through mc<1>/c<3> (for example, macro cell one, configuration bit three).

Figure 2D:
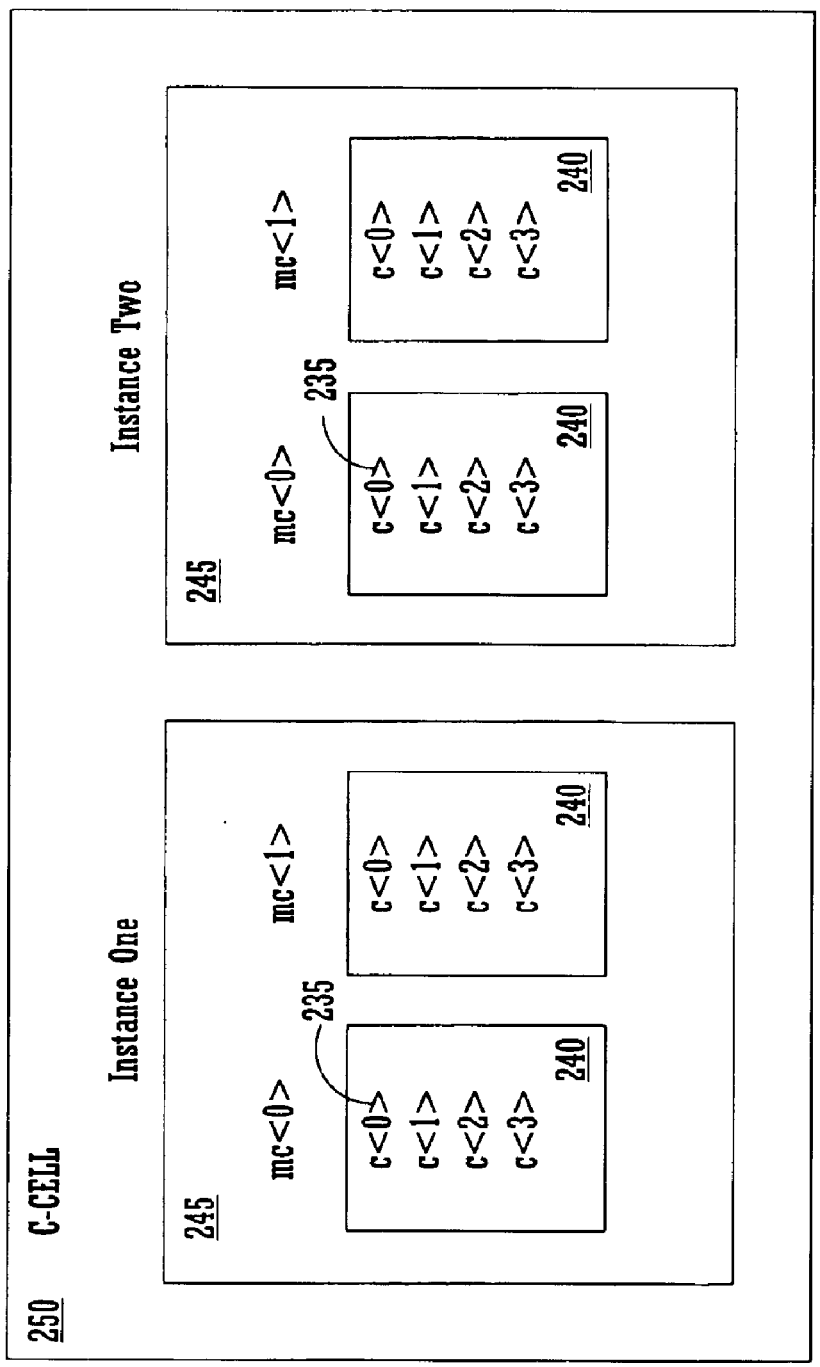

Referring now to FIG. 2D, an example is shown with a cell labeled as a C cell 250. The C cell 250 contains two separate instances of logic block 245. In this case, the two separate instances of logic block 245 do not represent new logical units. Therefore, an embodiment of the present invention will alphanumerically sort the two instances of logic block 245. For example, it will sort them as instance one and instance two. Then, the macro cells 240 in this example are re-numbered, as shown in FIG. 2E.

Figure 2E:
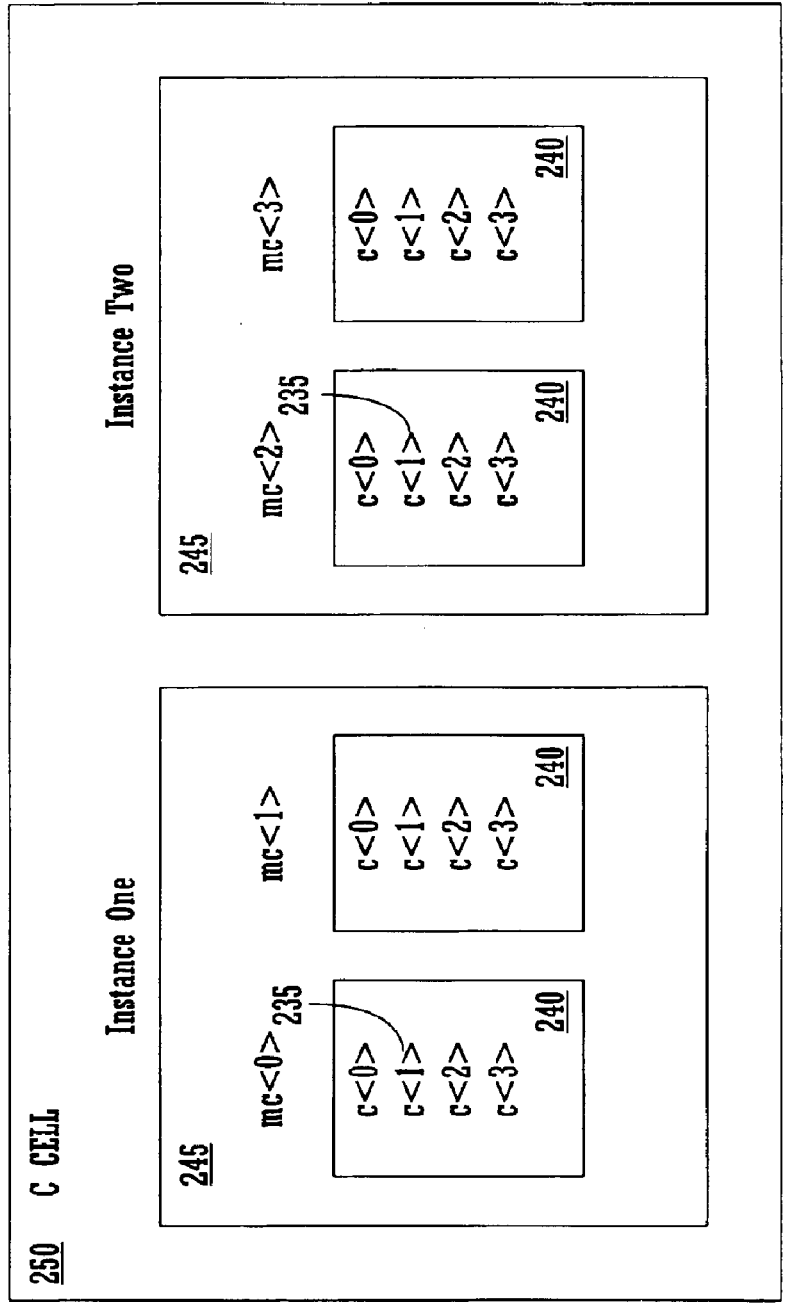

Referring to FIG. 2E, the macrocells (mc) for instance two for the logic block 245, have been renumbered to mc<2> and mc<3>. However, the configuration bits 235 are not renumbered.

The Configuration Bit Memory Cell

The lowest level in the hierarchy is a memory cell for a configuration bit 235. In one embodiment, the word line and bit line for the memory cell need to follow a naming convention. The word line needs to be named either "cfgwl", "wl", or "lwl". The bit line needs to be named either "cfgbl", "bl", or "lbl". This embodiment will trace up the word lines and bit lines hooked up to the configuration bit memory cells 235.

In this embodiment, the memory cell schematic should have a transistor that has the word line hooked up to the gate and the bit line hooked up to the source/drain. This embodiment will find the node to set by finding the net on the opposite source/drain as the bit line. This net should always be a pin in the memory cell. However, for Hspice netlists, it requires a local net, not a pin, be connected to this memory cell pin. The net one level up should never be a pin; it should always be an internal net.

The Configuration Block

In one embodiment, the configuration blocks follow a naming convention for its word lines and bit lines. The configuration block definition database will determine the actual word line and bit line terminal names. This is not a hard requirement because the cluster ram and channel memory do not have word lines and bit lines at the top level. In those cases, care must be taken to ensure that the word lines and bit lines that this embodiment makes up configure the bits in the correct order.

As this embodiment descends through the schematic hierarchy 202 for a configuration block, this embodiment will not descend into another configuration block. For example, the cluster ram is a configuration block. However, the cluster ram is placed inside of a cluster. When this embodiment identifies all of the configuration bits for a cluster, this embodiment will not descend into the cluster ram schematics.

Identifying the Word Lines and Bit Lines

In one embodiment, the word lines and bit lines are represented as a RC network in the schematics. In many cases, there will be an input pin and an output pin, such as "cfgwlin" and "cfgwlout", in each schematic. Although conceptually "cfgwlin" is the same word line as "cfgwlout", the actual nets are different. This embodiment is careful not to artificially double the number of bit lines or word lines in a cell, by having some of the configuration bits 235 connected to the "in" variant and the others connected to the "out" variant.

Whenever this embodiment sees a symbol that has two pins that are only different by "in" and "out" in their names, such as "cfgwlin" and "cfgwlout", it assumes that the two are really connected together and are only separated out to more accurately model the RC network. As this embodiment traces the bit lines and word lines up, it will always try to go with the "in" variant of the pin name.

Providing Word Lines and Bit Lines

In one embodiemnt, there are certain cases where the word lines and bit lines do not go to the top level of the configuration block. Two exemplary cases are the cluster ram and channel memory. For this embodiment to work optimally, each configuration bit 235 must be associated with a word line and bit line.

If this embodiment finds a configuration bit 235 in a cell which does not have a word line and a bit line connected which are pins, it will assume that all of the configuration bits 235 in that cell are likewise, and it will make up word lines and bit lines for all of them.

The lowest level cell that does not have word lines or bit lines as pins will have one word line that is named "wlAss<0>". It will have one bit line for each configuration bit 235, starting from 0, with the names "blAss<0>", "blAss<1>", . . . .

At the each level up, every instance will get one word line, "wlAss<#>", and all of the configuration bits 235 for that instance will be on a different bit line starting with "blAss<0>".

Figure 3A:
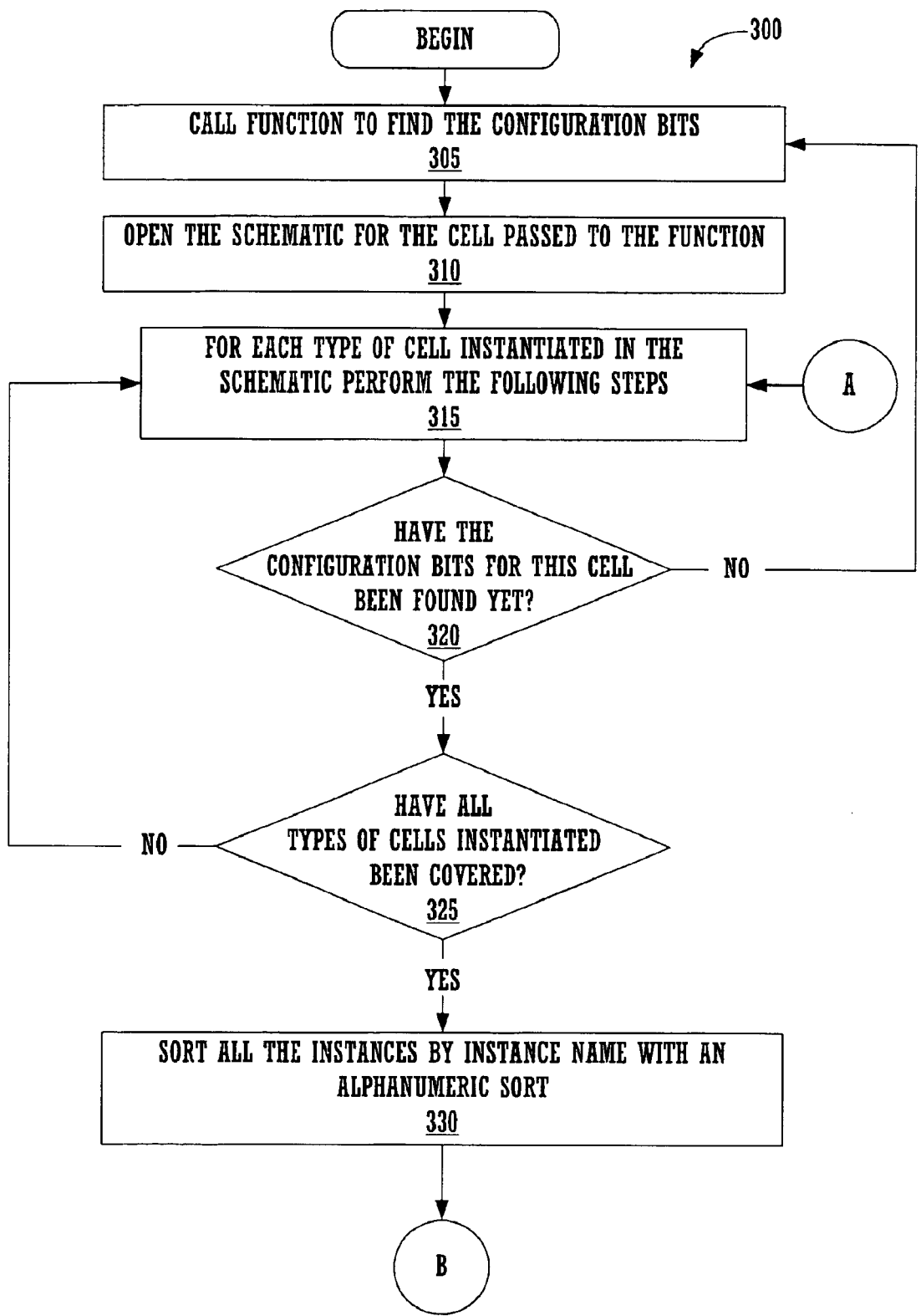
FIG. 3A, FIG. 3B, FIG. 3C, and FIG. 3D are flowcharts illustrating the process of steps of creating a configuration bit data structure, according to an embodiment of the present invention.

Referring now to FIG. 3A, steps of an embodiment of the present invention are shown illustrating the process 300 of identifying configuration circuit addresses in a schematic hierarchy 202. The process 300 may be realized as instruction code stored in computer readable memory units and executed by a processor. In step 305, a call is made to a function to find the configuration bits 235 in a schematic hierarchy 202. While this embodiment refers to finding configuration bits 235, it will be understood that the configuration bit 235 may be a memory cell containing a single bit of information. The input to the function is one cell 230 of the schematic hierarchy 202. For example, the C cell 250 from FIG. 2E may be passed in. The C cell 250 passed in may represent a physical circuit within the schematic hierarchy 202. As many physical circuits are repeated many time within the schematic hierarchy 202, there may be multiple instances of a given cell 250.

In step 310 the schematic for the C cell 250 that was passed into the function is opened. In step 315, a series of steps is begun for each type of cell 230 (e.g., each type of logical unit, such as a macro cell or logical block) which is instantiated in the schematic for the C cell 250 which was passed in to the function. For example, referring to FIG. 2E, C cell 250 contains two instances of logic block 245. Thus, in this example, one type of cell 230 is instantiated within cell C 250. Clearly, cell C 250 could contain other types of cells 230 at the same hierarchical level as the logic blocks 245, as well.

In step 320, the process 300 determines whether the configuration bits 235 have been found yet for the cell 230 which was instantiated within the schematic for the C cell 250 which was passed in to the function. The process 300 may make this determination by testing whether the function has been called yet with this type of cell 230. In this example, this would be the logic block type cell 245. If not, the function is recursively called. This call passes to the function the cell 230 which is instantiated within the schematic of the cell 230 which as just opened on this call to the function. In this example, a logic block type cell 245 is passed to the function.

Steps 305 through 325 are repeated until, the process 300 determines that the configuration bits 235 are found for each type of cell 230 which is instantiated down to the lowest level of the hierarchy with the original cell passed in. For example, the process 300 will eventually find the configuration bits 235 within the macro block type cell 240 in FIG. 2E. In summary, for this example there are three cell types: C, logic block, and macro cell (250, 245, 240) in descending order in the hierarchy. The process 300 does not need to open the schematic for each instantiation of a given cell type, (e.g., logic block, macro cell, or C) because the contents of that cell 230 will be the same as for others of that cell type.

In step 330, the process 300 sorts all of the instance names with an alphanumeric sort. For example, referring to FIG. 2E, logic block 245 has instance one and instance two. These two cells 230 are sorted in this order, in this step. Or, referring to FIG. 2B, each instantiation of macro cell 240 within logic block 245 is sorted in the order, first, second, third, and z_last. However, the present invention is not limited to this sort method; any convenient type of sort may be used, in other embodiments.

Figure 3B:
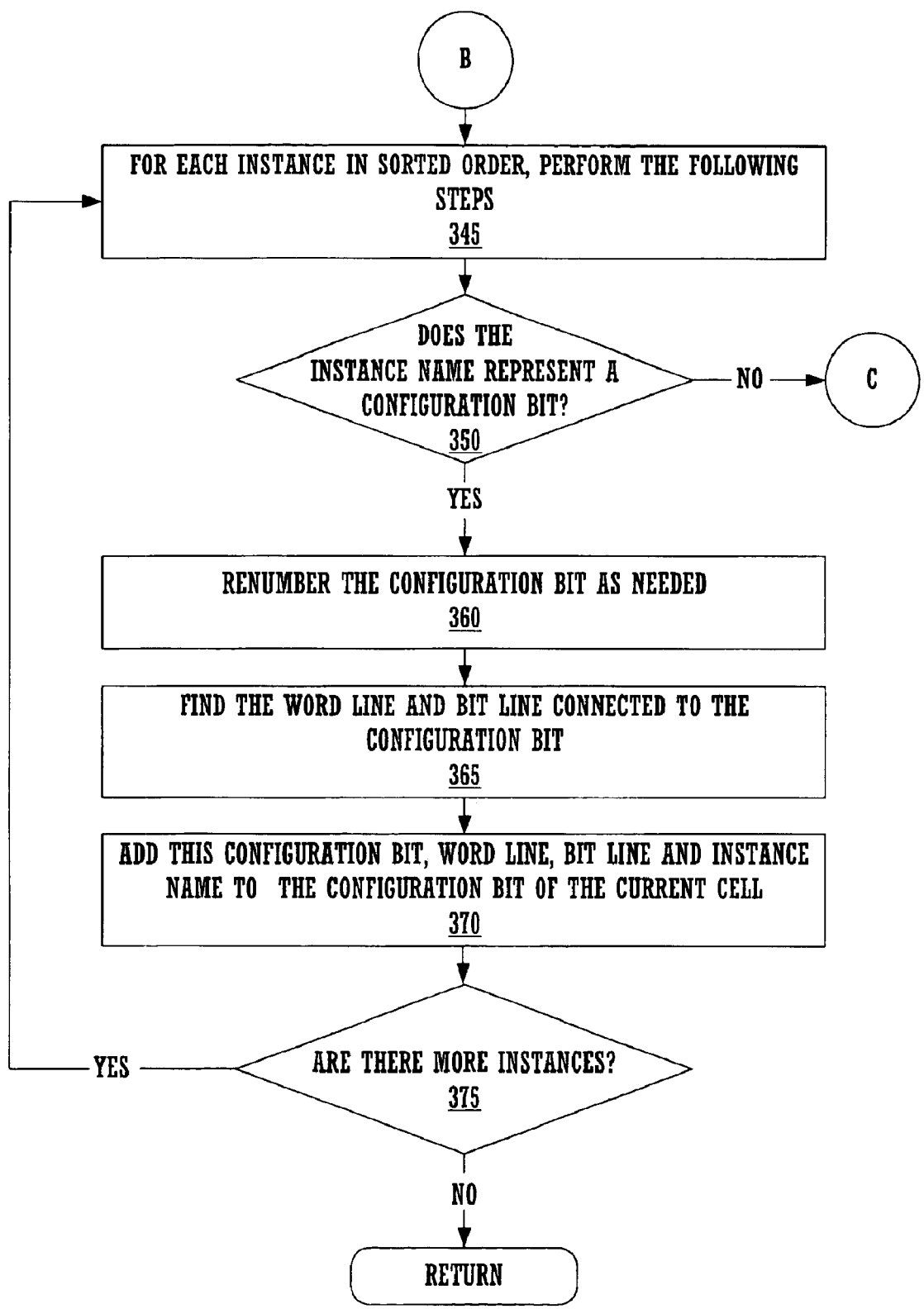

The process 300 continues in FIG. 3B by performing a series of steps for each instance in sorted order, in step 345. In step 350, the process 300 determines whether the instance name represents a configuration bit 235, e.g., the lowest memory cell in the hierarchy. If it does represent a configuration bit 235, then the process 300 renumbers the configuration bit 235 as needed, in step 360. FIG. 2A–FIG. 2E illustrate further details of a renumbering process.

Next, in step 365, the process finds the wordline and the bitline connected to this configuration bit 235. Each configuration bit 235 has one such wordline and one such bitline connected to it. These lines may be used to specify the configuration bit's address. For example, a CPLD may have a number of configuration blocks, each block with an array of configuration bits 235. One axis of the array corresponds to the bitline, the other to the wordline. Each configuration bit 235 has a unique address in one of these configuration block arrays.

Next, in step 370, the process 300 adds the logical name of the configuration bit 235, the wordline and bitline addresses of the configuration bit 235, and the instance name to the data structure 200 of configuration bits 235 of the current cell, for example, the cell 230 which was passed in to the function. In this fashion, this embodiment builds up a data structure 200 which identifies circuit addresses of a schematic hierarchy 202.

In step 375, the process 300 determines whether there are more instances in the sorted order of instances from step 345. If there are, steps 350 through 370 are repeated. When there are no more instances for the cell 230 which was passed into the function, the process returns. Thus, the recursive process may then traverse back up the hierarchy 202 to operate on a cell 230 at a higher level.

Figure 3C:
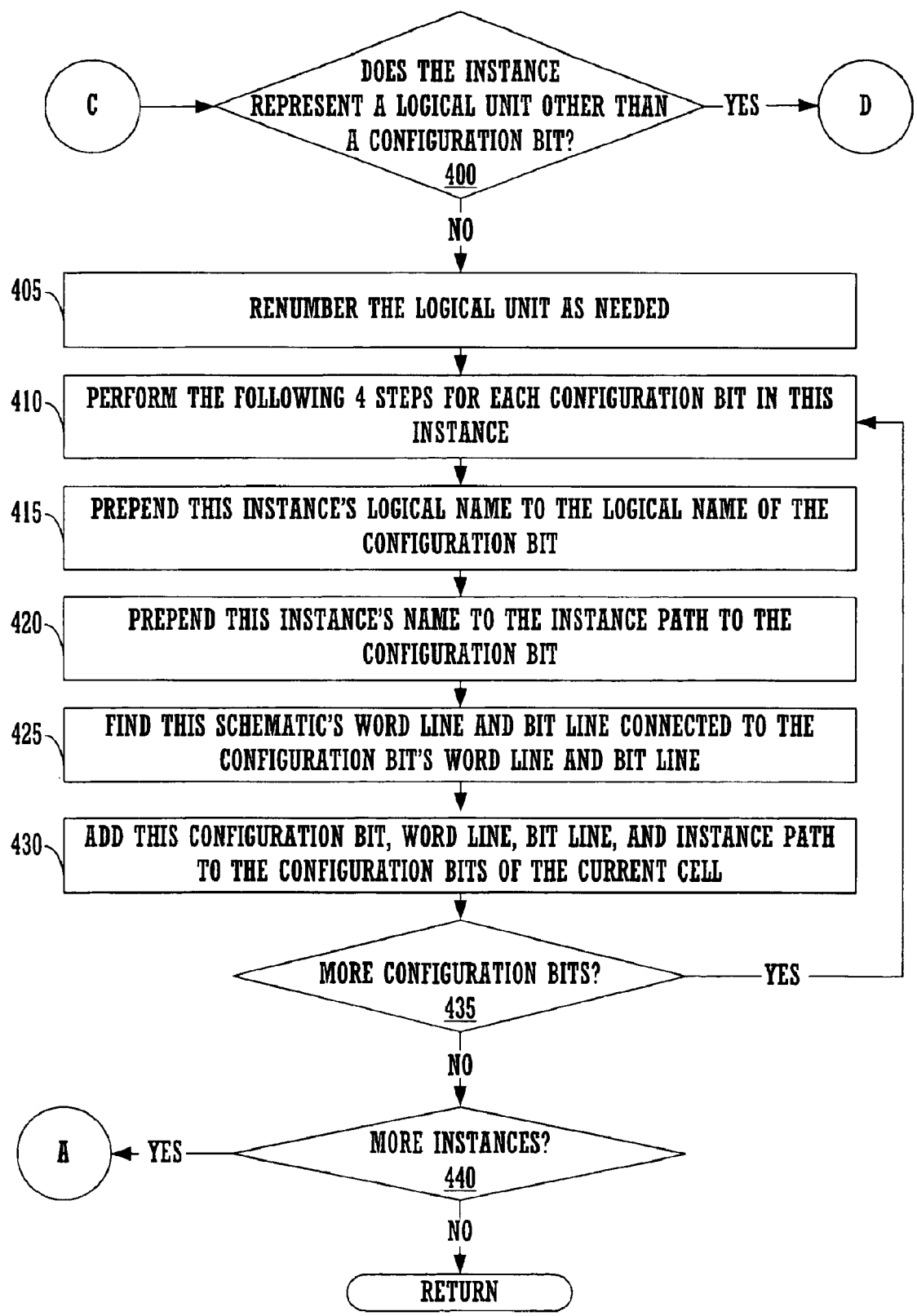

If the process determines, in step 350, that the instance name does not represent a configuration bit 235, then the process continues in FIG. 3C. In step 400, the process 300 determines whether the instance represents a logical unit other than a configuration bit 235. For example, the logical unit may be a macro cell 240 or a logic block 245. One embodiment checks a list of logical unit names to determine whether the instance name is a logical unit. If the process 300 determines that this is the case, the logical unit is renumber as needed, in step 405. The renumbering of the logical unit proceeds as shown in FIG. 2A–FIG. 2E.

Next, in step 410, the process performs a series of steps for each configuration bit 235 within the instance. In step 415, the process 300 prepends the instances logical name to the logical name of the configuration bit 235. For example, mc<0> may be prepended to c<0> to form mc<0>/c<0>.

In step 420, the process 300 prepends the instance's name to the instance path to the configuration bit 235. For example, "inst3" "mc<0> may be prepended to "inst18" "c<0>" forming "inst3" "mc<0>" "inst18" "c<0>". In this fashion, a instance path down the schematic hierarchy 202 to the configuration bit 235 (memory cell) is constructed.

In step 425, the process 300 finds the schematic's wordline and bitline connected to the configuration bit's wordline and bitline. In step 430, the process 300 adds the configuration bit's logical name, its wordline and bitline addresses, and the instance path to the configuration bit 235 to the data structure of configuration bits 200 of the current cell, for example, the cell which was passed in to the function.

Next, in step 435 the process 300 determines if there are more configuration bits 235 in this instance, and if so repeats steps 415 through 430 until there are no more configuration bits 235 in this instance.

In step 440, the process 300 determines if there are more instances in this cell. If so, the process repeats step 345 for the next instance in the sorted order for this cell. When there are no more instances, the process returns and the recursively called function may operate on the next cell.

Figure 3D:
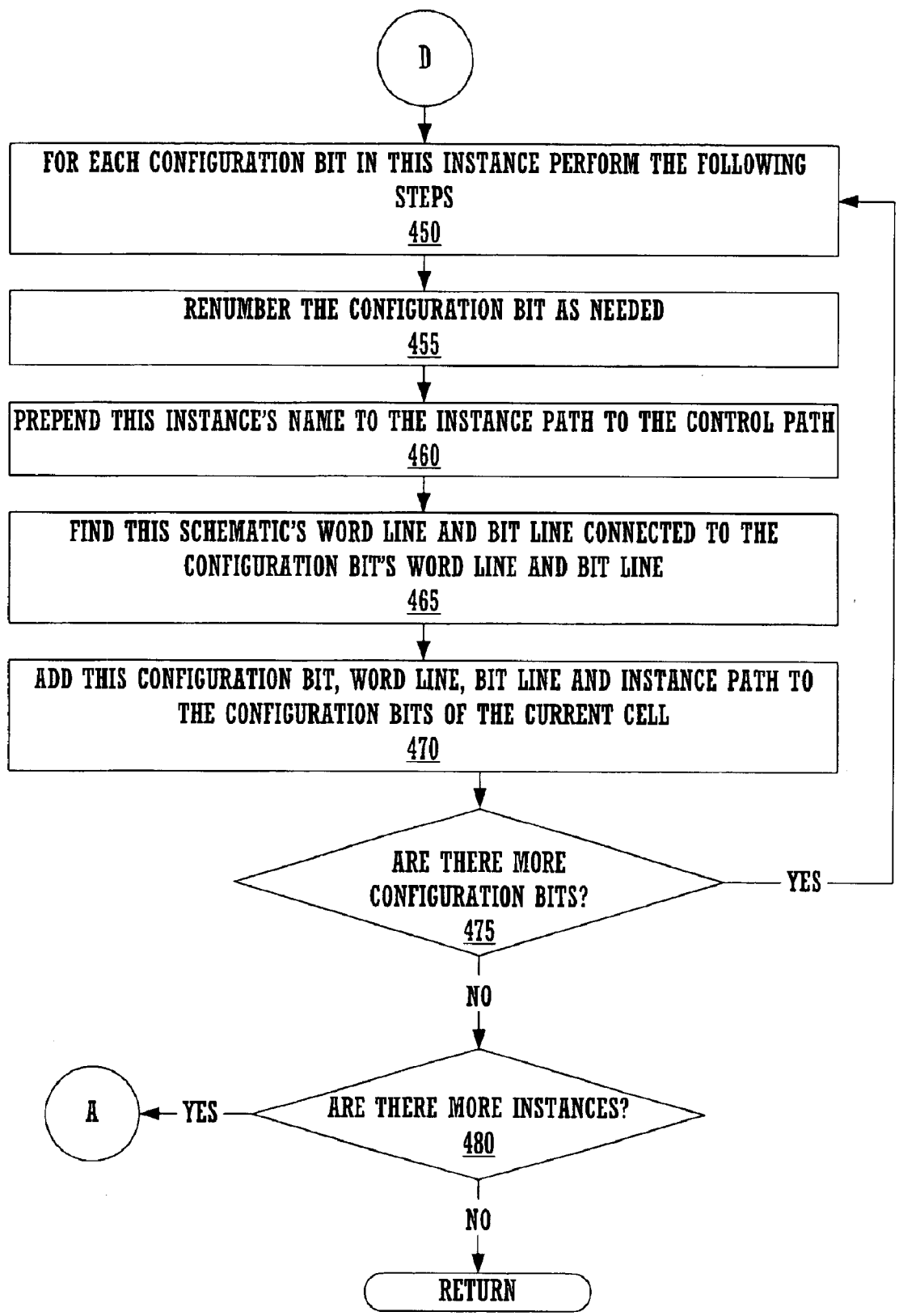

If the determination in step 400 determines that the instance did not represent a logical unit other than a configuration bit 235, then the process continues in FIG. 3D. In step 450, the process 300 begins a series of steps for each configuration bit 235 in the instance. In step 455, the process renumbers the configuration bit 235 as needed.

In step 460, the process prepends this instance's name to the instance path to the configuration bit 235. In this fashion, when finished, the process 300 is able to trace a path from the highest level of the schematic hierarchy 202 down to each specific configuration bit 235.

In step 465, the process 300 finds the wordline and the bitline for the schematic for this instance which is connected to the wordline and the bitline of this configuration bit 235. Then, in step 470, the process 300 adds this configuration bit's logical name, the configuration bit's wordline and bitline addresses, and the instance path to the configuration bit 235 to the configuration bit data structure 206 along with the rest of the information for this cell.

In step 475, the process 300 determines if there are more configuration bits 235 for this instance, and if so repeats step 450 through step 470. When the process 300 has handled all configuration bits 235 for this instance, the process 300 checks to see if there are more instances, in step 480. If there are more instances, the process repeats step 345 for the next instance in the sorted order for this cell. When there are no more instances, the process returns and the recursively called function may operate on the next cell up the schematic hierarchy 202. Eventually, the entire schematic hierarchy is traversed and the data structure 200 containing the configuration bit addresses is complete. In another embodiment, the traversal is run on only a portion of the schematic hierarchy 200.

The following is exemplary pseudocode for the process 300 of FIGS. 3A–3D.

```
function findConfigBits (cell)
    open the schematic for the cell
    for each type of cell instantiated in the schematic
        if it has not yet found the configuration bits for the cell
            that is instantiated
            recursively call findConfigBits for the cell that is
                instantiated
        end if
    end for each
    sort all of the instances by instance name with an alpha-
        numeric sort
    for each instance in sorted order
        if the instance name represents a configuration bit
            renumber the configuration bit as needed
            find the word line and bit line connected to the
                configuration bit
            add this config bit, word line, bit line, and instance
                name to the config bits of the current cell
        else if the instance name represents a logical unit other
            than a configuration bit
            renumber the logical unit as needed
            for each configuration bit in this instance
                prepend this instances logical name to the logical
                    name of the config bit
                prepend this instance name to the instance path to
                    the config bit
                find this schematic's word line and bit line con-
                    nected to the configuration bit's word line and
                    bit line
                add this config bit, word line, bit line, and
                    instance path to the config bits of the current
                    cell
            end for each
        else
            for each configuration bit in this instance
                renumber the configuration bit as needed
                prepend this instance name to the instance path to
                    the config bit
                find this schematic's word line and bit line con-
                    nected to the configuration bit's word line and
                    bit line
                add this config bit, word line, bit line, and
                    instance path to the config bits of the current
                    cell
            end for each
        end if
    end for each
end function findConfigBits
```

Configuration Block Definition Database

The configuration block definition database will provide the most basic information for each configuration block type. Each line will list the configuration block logical name, the database library name, cell name, and view name, and word line terminal name and bit line terminal name. The word line terminal name and bit line terminal name determine the order in which the config bits are shifted into the CPLD for each configuration block. For example:

lines that begin with # are comments
libName cellName viewName wlTermName blTermName logicalUnitName
c39cl c39cl_core schematic cfgwl<187:0> cfgbl<0:421> cl
c39cr c39cr_marray schematic wlAss<0:31> blAss<0:255> cr
c39cm c39cm_marray schematic wlAss<0:31> blAss<0:127> cm The word line and bit line terminal names determine the order in which the bits are shifted into the part. With this configuration line, the cluster (cl) will shift in its configuration bits 235 in the order:

cfgwl<187>, cfgbl<0>
cfgwl<187>, cfgbl<1>
. . .
cfgwl<187>, cfgbl<421>
cfgwl<186>, cfgbl<0>
cfgwl<186>, cfgbl<1>
. . .
cfgwl<0>, cfgbl<421>

Bitstream

The bitstream is an ASCII file with the settings for the configuration bits 235. There will be only '1' and '0' characters in the bitstream; there will not be any spaces or carriage returns or comments. In one embodiment, a bitstream must be comprised of whole configuration blocks.

Generating a Bit Order Data Structure

Figure 4A:
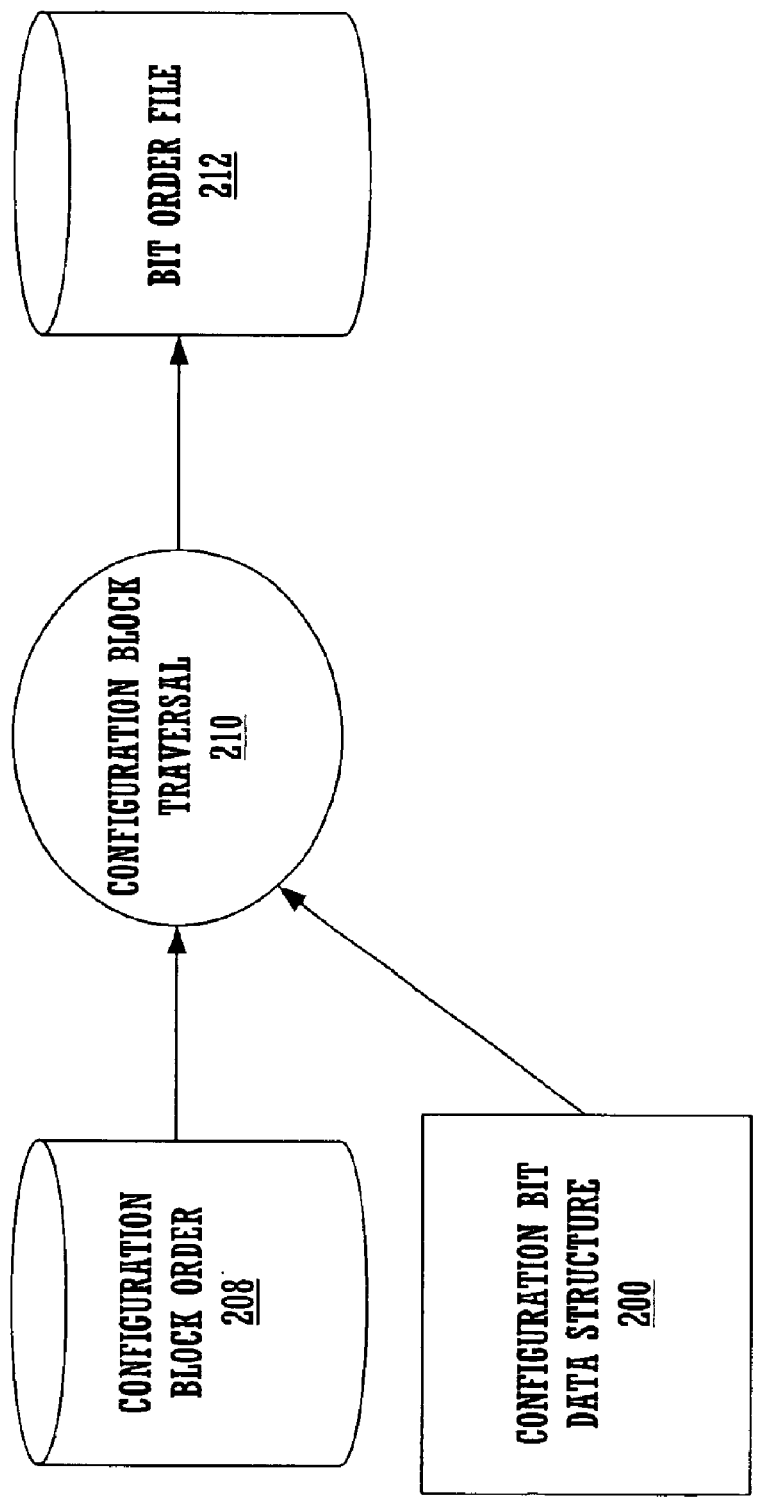
FIG. 4A is a diagram illustrating the input databases and the output bit order data structure in relation to an embodiment of the present invention.

Referring to FIG. 4A, an embodiment of the present invention inputs a configuration block order database 208 and a configuration bit data structure 200 and outputs a bit order data structure 212. The configuration block order database 208 lists the order in which the configuration blocks are programmed and the order in which the word-lines and the bit-lines are shifted into the programmed logic device (e.g., CPLD).

Figure 4B:
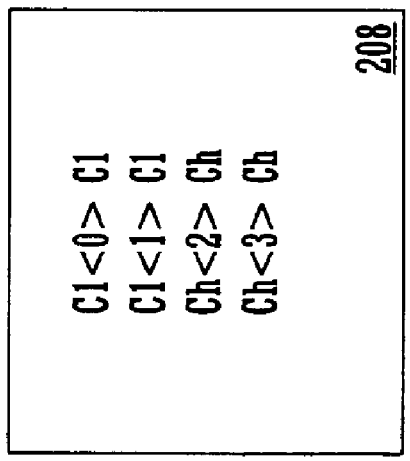
FIG. 4B is an exemplary configuration block order database, which may be used an input to an embodiment of the present invention.

FIG. 4B illustrates an exemplary configuration block order database 208. The database 208 describes the order in which the configuration blocks are included in the bitstream used to load the configuration bits into a CPLD. Each line represents a configuration block with a unique name, for example, a top level logical name. The database 208 may also contain the logical unit type. The abbreviations in this database are defined herein in connection with an exemplary list of logical unit names for various cells and their logical hierarchy, for example, 'cl' refers to cluster.

The bit order data structure 212 is a hierarchical description of the order of all of the configuration bits 245 for the programmable logic device. FIG. 4C illustrates an exemplary bit order data structure 212. The database 212 contains a begin line 254, which begins the declaration of a configuration block. The format for the begin line is: begin <configuration block name> <numberWordLines> <numberBitlines>. In this case the 'cl' indicates that the configuration block name is a cluster. The begin line also specifies the number of word lines and bit lines in the configuration block. In this example, 188 word lines and 422 bit lines.

Still referring to FIG. 4C, after the begin line 254, the bit order data structure 212 contains a series of lines containing the hierarchical logical configuration bit names 256, one per line. The format for this line is: <configuration bit logical name> [spacer multiplier]. The bits will be listed in the order in which they are to be loaded into the programmable logic device. A spacer is a hole in the configuration address space.

If there are contiguous spacers, the spacer multiplier specifies how many contiguous spacers there are.

Still referring to FIG. 4C, another type of line in the bit order data structure 212 is the end line 258. The end line ends the declaration of a configuration block and has the format: end <configuration block name>.

Still referring to FIG. 4C, a fourth type of line is an instance line 260, and has the format: inst<configuration block name> <instance name> [<rowNumber> <colummn-Number> [instanceNumber]]. The instance line 260 declares an instance of a configuration block that is fully defined previously in the bit order data structure 212. It will replicate the configuration block's hierarchy of configuration bits 245 starting from the instance name.

Still referring to FIG. 4C, the final type of line is an endWordLine 262, which has the format: endWordLine <wordLineNumber>. The endWordLine 262 marks the end of a word-line. The bit order data structure 212 contains information for all word-lines starting at zero.

Figure 5:
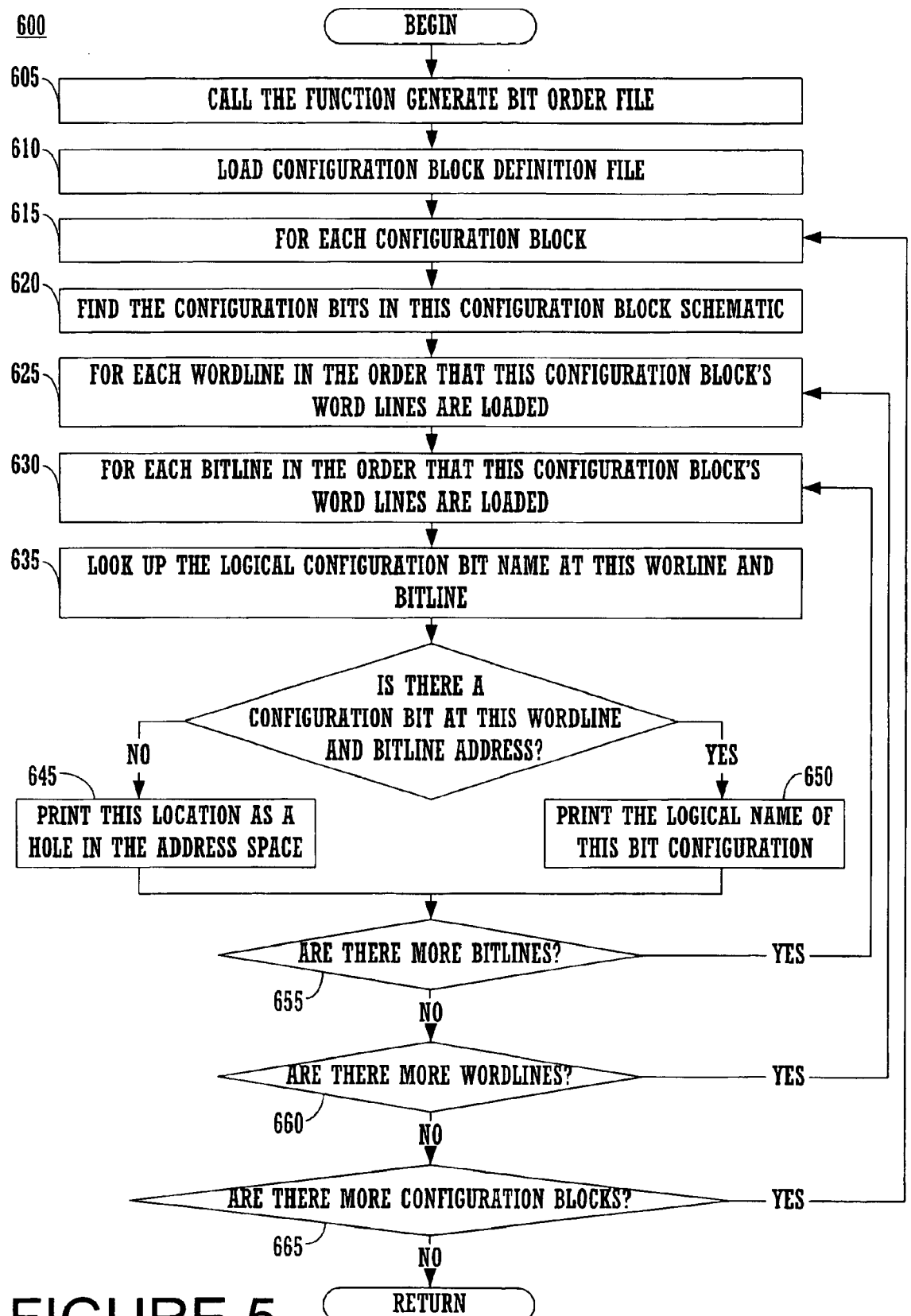
FIG. 5 is a flowchart illustrating the process of steps of creating a bit order data structure, according to an embodiment of the present invention.

FIG. 5 illustrates a process 600 of generating a configuration bit order data structure 212. Process 600 may be realized as instruction code stored in computer readable memory units and executed by a processor. The process 600 begins by calling a function which generates the configuration bit order data structure 212, in step 605. In step 610, a configuration block definition database 208 is loaded. In step 615, a series of steps is begun for each configuration block in the configuration definition block database 208.

In step 620, the configuration bits 235 for the schematic of this configuration block are found. In steps 625 though 635, the process will walk through the address space of the configuration block in the order in which configuration bits 235 are to be loaded and look up the logical configuration bit name 224 at a unique address in the configuration block, as specified by the wordline 220 and the bitline 222. The process 600 looks up this information in the configuration bit data structure 200, which was built from traversing the schematic database 202.

In step 640, the process will determine whether there is a configuration bit 235 at this address or a hole in the address space. As discussed herein, the address space may contain some holes where a particular address does not connect to an actual configuration bit memory cell.

Depending on the outcome of step 640, the process will either, in step 645, print this location as a hole in the address space, or the process will print the logical name 224 of the configuration bit, in step 650.

In steps 655 and 660, the process checks for more bitlines and wordlines as a part of its walk through the address space. When it finishes the address space of this configuration block, the process checks to see if there is another configuration block, in step 665. If there is, the process repeats from step 610. When all configuration blocks have been processed the process ends.

Figure 6:
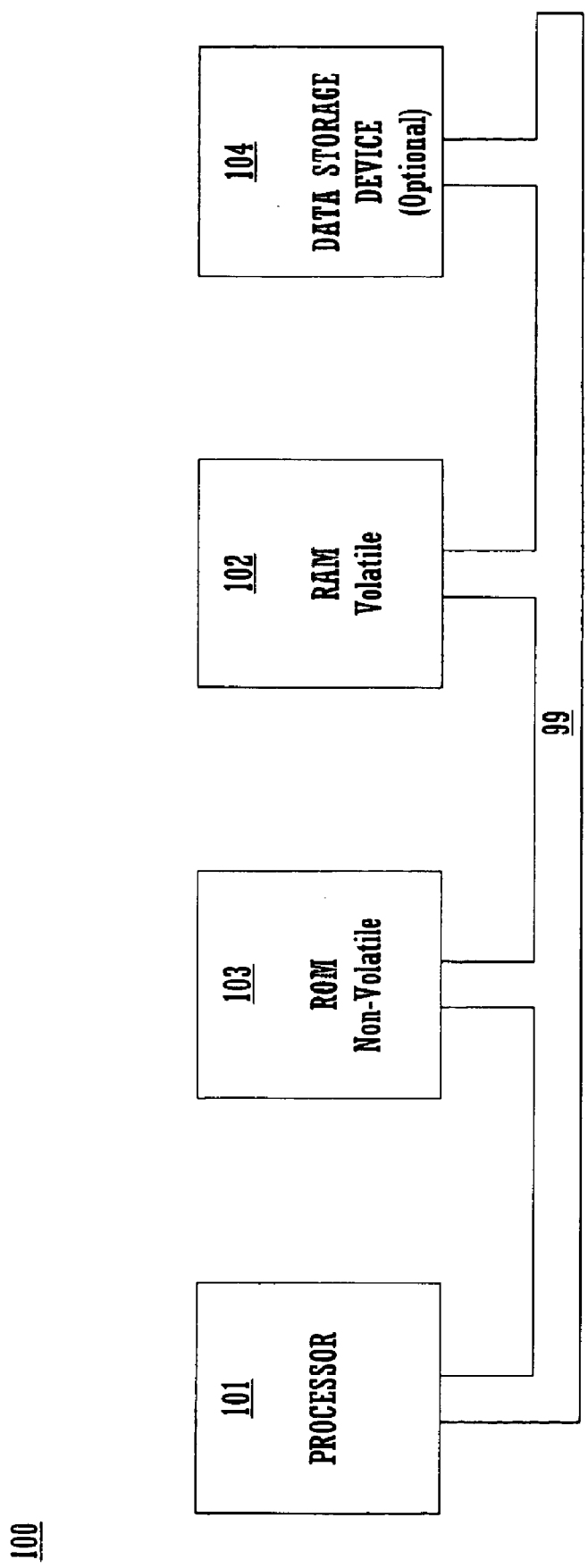
FIG. 6 is a block diagram of a computer system, which may be used as a platform to implement embodiments of the present invention.

FIG. 6 illustrates circuitry of computer system 100, which may form a platform for a portion of the any of the nodes. Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a nonvolatile memory 103 (e.g., read only memory ROM) coupled with the bus 99 for storing static information and instructions for the processor 101. Computer system 100 also includes an optional data storage device 104 coupled with the bus 99 for storing information and instructions.

The preferred embodiment of the present invention, a method and system for automatically building a bit order data structure of configuration bits for a programmable logic device, is thus described. While the present invention has been described in particular embodiments, it should be appreciated that the present invention should not be construed as limited by such embodiments, but rather construed according to the below claims.

What is claimed is:

1. A computer implemented method of generating an order of loading data into a programmable device comprising the steps of:
   a) automatically identifying a plurality of configuration bits for programming a programmable device by traversing a hierarchical schematic representation of the programmable device;
   b) automatically determining a plurality of addresses corresponding to said plurality of configuration bits, said plurality of addresses being in an address space of a memory of the programmable device and operable to store configuration bits for programming the programmable device;
   c) automatically determining a plurality of logical names for said plurality of configuration bits; and
   d) based on an order in which said address space is traversed when programming said programmable device, automatically storing said plurality of logical names for said plurality of configuration bits within a data structure within computer readable memory, wherein said data structure describes an order in which to program said programmable device.

2. The method of claim 1 wherein step a) comprises the step of:
   a1) identifying configuration bits of said plurality of configuration bits which are at the lowest level in said hierarchical schematic representation.

3. The method of claim 1 wherein step b) comprises the steps of:
   b1) determining a wordline associated with a configuration bit of said plurality of configuration bits; and
   b2) determining a bitline associated with said configuration bit of said plurality of configuration bits.

4. The method of claim 1 further comprising the step of:
   e) repeating said steps a) through d) for each configuration block of said programmable device.

5. The method of claim 1 wherein said d) comprises:
   determining whether there is a configuration bit at an address of said plurality of addresses in a configuration block of said programmable device.

6. The method of claim 5 wherein said d) further comprises:
   placing a spacer in said data structure of said plurality of logical names responsive to a determination that there was no configuration bit at said address in said configuration block.

7. The method of claim 1 wherein said programmable device is a complex programmable logic device (CPLD).

8. The computer implemented method of claim 1, further comprising:
   e) receiving a modification to said hierarchical schematic representation of said programmable device; and
   f) repeating said a) through d) using said modified hierarchical schematic representation of said programmable device to automatically generate a new order in which to program said programmable device.

9. A computer implemented method of generating an order of loading data into a programmable logic device comprising the steps of:
- a) accessing a data structure comprising a plurality of logical names corresponding to a plurality of addresses in an address space of a memory operable to store configuration bits for programming a programmable logic device;
- b) accessing a data structure specifying an order in which said plurality of addresses are traversed when loading said configuration bits into said programmable logic device;
- c) automatically ordering said plurality of logical names from step a) based on the order specified in said data structure in step b) and information in the data structure comprising the plurality of logical names corresponding to the plurality of addresses, said ordering comprising determining whether there is a configuration bit at addresses in the address space based on information in the data structure comprising the plurality of logical names; and
- d) automatically storing said ordered plurality of logical names from step c) in a data structure within computer readable memory, wherein said ordered plurality of logical names describe an order of loading said configuration bits into said programmable logic device.

10. The method of claim 9 further comprising storing a placeholder in said data structure of said plurality of logical names from step d) if a given address in the address space of the memory operable to store configuration bits does not require a configuration bit.

11. The method of claim 9 further comprising traversing a hierarchical schematic representation of the programmable device to automatically construct the data structure comprising the plurality of logical names corresponding to the plurality of addresses, said traversing comprising:
- automatically identifying the configuration bits for programming said programmable device;
- automatically identifying said plurality of addresses corresponding to said configuration bits; and
- automatically determining said plurality of logical names for said configuration bits.

12. The method of claim 11 wherein said identifying the configuration bits comprises identifying said configuration bits which are at the lowest level in said hierarchical schematic representation.

13. A system comprising a processor coupled to a bus and memory coupled to said bus wherein said memory contains processor instructions for implementing a method of generating an order of loading data into a programmable logic device, said method comprising the steps of:
- a) accessing a configuration bit data structure comprising a plurality of logical names corresponding to a plurality of addresses in an address space of a memory operable to store configuration bits for programming a programmable logic device;
- b) accessing an address order data structure specifying an order in which said address space is traversed when loading said configuration bits into said programmable logic device; and
- c) constructing a bit order data structure within computer readable memory that describes an order of loading said configuration bits into said programmable logic device by repeating c1)–c3) for addresses in the address space based on the address order data structure, wherein said c1)–c3) comprise:
  - c1) determining whether an address in the address space comprises a configuration bit, based on the configuration bit data structure;
  - c2) automatically storing a space in said bit order data structure responsive to a determination in said c1) that there is no configuration bit at the address in the address space; and
  - c3) automatically storing the logical name of the configuration bit in the bit order data structure based on the configuration bit data structure, responsive to a determination in said c1) that there is a configuration bit at the address in the address space.

14. The system of claim 13, wherein said method further comprises:
- d) traversing a hierarchical schematic representation of the programmable device to automatically construct the configuration bit data structure, said traversing comprising:
  - d1) automatically identifying the configuration bits;
  - d2) automatically identifying said plurality of addresses corresponding to the configuration bits; and
  - d3) automatically determining said plurality of logical names for the configuration bits.

15. The system of claim 14, wherein said automatically identifying the configuration bits comprises identifying the configuration bits which are at the lowest level in said hierarchical schematic representation.

16. The system of claim 14, further comprising:
- receiving a modification to said hierarchical schematic representation of said programmable device;
- repeating said d), wherein said modified hierarchical schematic representation is traversed to automatically construct a new configuration bit data structure; and
- repeating said a) through c) using said new configuration bit data structure to automatically generate a new order in which to program said programmable device.

* * * * *